United States Patent
Kwon et al.

(10) Patent No.: US 10,359,950 B2
(45) Date of Patent: Jul. 23, 2019

(54) NONVOLATILE MEMORY DEVICE AND OPERATING METHOD THEREOF

(71) Applicant: SK hynix Inc., Gyeonggi-do (KR)

(72) Inventors: Jung-Hyun Kwon, Seoul (KR); Sang-Gu Jo, Gyeonggi-do (KR); Sung-Eun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/715,271

(22) Filed: Sep. 26, 2017

(65) Prior Publication Data

US 2018/0203616 A1 Jul. 19, 2018

(30) Foreign Application Priority Data

Jan. 18, 2017 (KR) .................. 10-2017-0008483

(51) Int. Cl.
*G06F 3/06* (2006.01)
*G11C 13/00* (2006.01)

(52) U.S. Cl.
CPC .......... *G06F 3/0616* (2013.01); *G06F 3/0619* (2013.01); *G06F 3/0659* (2013.01); *G06F 3/0679* (2013.01); *G06F 3/0688* (2013.01); *G11C 13/0004* (2013.01); *G11C 13/0069* (2013.01); *G11C 13/004* (2013.01); *G11C 2013/0076* (2013.01); *G11C 2207/2263* (2013.01); *Y02D 10/13* (2018.01)

(58) Field of Classification Search
CPC .... G06F 3/0616; G06F 3/0679; G06F 3/0659; G11C 13/0004; G11C 13/004; G11C 13/0069
See application file for complete search history.

(56) References Cited

U.S. PATENT DOCUMENTS

| 9,406,378 B2 | 8/2016 | Chu | |
|---|---|---|---|
| 2011/0188292 A1* | 8/2011 | Joo | G11C 13/0064 365/148 |
| 2016/0373264 A1* | 12/2016 | Katoh | H04L 9/3278 |

FOREIGN PATENT DOCUMENTS

KR 100827702 5/2008

* cited by examiner

*Primary Examiner* — Mohammed A Bashar
(74) *Attorney, Agent, or Firm* — IP & T Group LLP

(57) ABSTRACT

A memory device may include a memory cell array having a plurality of memory cells, and a controller suitable for reading data of a memory cell corresponding to an address of write data, among the memory cells, and comparing the write data and the read data to check specific bits different from corresponding bits of the read data, among a plurality of bits of the write data, according to a write operation request. The controller may output a check result to outside after a preset time from the write operation request.

23 Claims, 5 Drawing Sheets

NONVOLATILE MEMORY DEVICE AND OPERATING METHOD THEREOF

CROSS-REFERENCE TO RELATED APPLICATIONS

The present application claims priority of Korean Patent Application No. 10-2017-0008483, filed on Jan. 18, 2017, which is herein incorporated by reference in its entirety.

BACKGROUND

1. Field

Various embodiments relate to a memory device, and more particularly, to a nonvolatile memory device for performing a write operation.

2. Description of the Related Art

Examples of a semiconductor memory device using a resistance material may include a phase-change random access memory (PRAM), a magneto-resistive RAM (MRAM), a resistive RAM (RRAM) and the like. While a dynamic RAM (DRAM) or flash memory device stores data using a charge, the semiconductor memory device using a resistance material stores data using a state change of a phase change material such as chalcogenide alloy (PRAM), a resistance change of a magnetic tunnel junction (MJT) thin film depending on a magnetization state of a ferromagnetic material (MRAM) or a resistance change of a variable resistance material (RRAM).

Since the PRAM can randomly access data while exhibiting a nonvolatile characteristic, the PRAM is applied to a variety of semiconductor systems and semiconductor memory devices. A unit memory cell of the PRAM includes one cell transistor coupled to a word line and one variable resistor coupled to a bit line. The variable resistor is a phase change material formed of a thin-film material such as chalcogenide alloy.

The PRAM may store data using a state change of the phase change material according to a current applied to the memory cell. That is, the phase-change material may have a crystalline phase or amorphous phase depending on the applied current, and the memory cell may store data using the characteristic that the resistance of the crystalline state is different from that of the amorphous phase.

FIGS. 1A and 1B are diagrams for describing a write operation of storing data in one memory cell of the PRAM.

Referring to FIG. 1A, when a low current equal to or less than a threshold value flows through a memory cell 100 including a phase-change resistor, the phase-change resistor has a temperature suitable for crystallization. Thus, the memory cell 100 is converted into the crystalline phase, and becomes a low-resistance material.

Alternatively, referring to FIG. 1B, when a high current greater than the threshold value flows through the memory cell 100, the temperature of the phase change resistor reaches a temperature equal to or greater than a melting point. Thus, the memory cell 100 is converted into the amorphous phase, and becomes a high-resistance material.

As such, the memory cell 100 constituting the PRAM has two kinds of states, that is, the crystalline phase and the amorphous phase, depending on a write operation. The crystalline phase may indicate a logical value '0' (Logical 0) of data since the resistance thereof has a relatively low magnitude, and the amorphous phase may indicate a logical value '1' (Logical 1) of data since the resistance thereof has a relatively high magnitude. A write operation of changing the data of the memory cell 100 from the logical value '0' to the logical value '1' may be referred to as a RESET operation, and a write operation of changing the data of the memory cell 100 from the logical value '1' to the logical value '0' may be referred to as a SET operation.

FIG. 2 is a graph illustrating current pulses for write and read operations of the PRAM illustrated in FIGS. 1A and 1B.

Referring to FIG. 2, since the write operation may include the RESET and SET operations for writing data to memory cells, the state of the phase change material is changed depending on the RESET and SET operations. Therefore, a large amount of current and a longer latency may be required during the write operation, for example, refer to the RESET and SET pulses. However, the read operation is an operation for sensing only the current state of the phase change material. Therefore, a small amount of current and a shorter latency may be required during the read operation, for example, refer to the READ pulse.

Therefore, the write operation rather than the read operation performed on the PRAM may cause a large amount of current to flow into the phase change material, while the state of the phase change material is continuously changed. As a result, the PRAM may be worn out. In order to store normal data in memory cells constituting the PRAM, the number of write operations may be limited. For example, a maximum of hundred thousand write operations can be performed per memory cell. That is, when data are written hundred thousand times to one memory cell, the memory cell may not be used any more. The entire PRAM may not be used since one memory cell cannot be used. Therefore, research is being conducted on a method for efficiently reducing the number of write operations performed in each of the memory cells of the PRAM.

SUMMARY

Various embodiments are directed to a memory device capable of detecting specific bits of write data, which are different from bits of previously stored data therein, and efficiently performing a write operation based on a detection result, and an operating method thereof.

Also, various embodiments are directed to a memory device capable of notifying information on specific bits of write data, which are different from bits of previously stored data therein, while performing a write operation according to a write operation request, and an operating method thereof.

In accordance with an embodiment of the present invention, a memory device includes a memory cell array having a plurality of memory cells; and a controller suitable for reading data of a memory cell corresponding to an address of write data, among the memory cells, and comparing the write data and the read data to check specific bits different from corresponding bits of the read data, among a plurality of bits of the write data, according to a write operation request, wherein the controller outputs a check result to outside after a preset time from the write operation request.

In accordance with an embodiment of the present invention, a memory device includes: a memory cell array having a plurality of memory cells; a controller suitable for reading data of a memory cell corresponding to an address of write data, among the plurality of memory cells, checking specific bits different from corresponding bits of the read data, among a plurality of bits of the write data, and modulating the write data based on a check result, according to a write operation request; and a read/write circuit suitable for writing the modulated data to the corresponding memory cell based on the check result, wherein the controller outputs the check result to outside after a preset time from the write operation request.

In accordance with an embodiment of the present invention, an operating method of a memory device includes: receiving write data to store in a memory cell array including a plurality of memory cells, in response to a write command; reading data of a memory cell corresponding to an address of the write data among the plurality of memory cells; comparing the write data and the read data, and checking specific bits different from corresponding bits of the read data, among a plurality of bits of the write data; and outputting a check result to outside, after a preset time from an input of the write command.

DETAILED DESCRIPTION

Figure 1A:
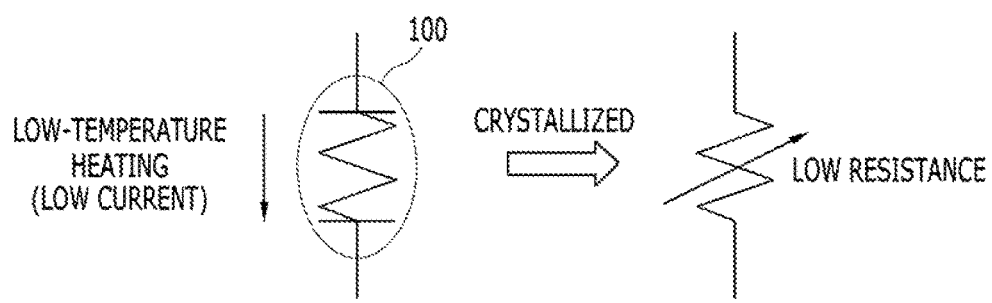
FIGS. 1A and 1B are diagrams for describing a write operation of storing data in one memory cell of a PRAM.
Figure 1B:
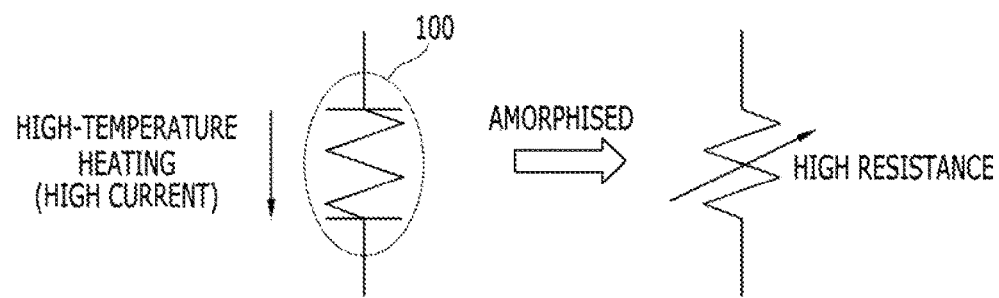

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
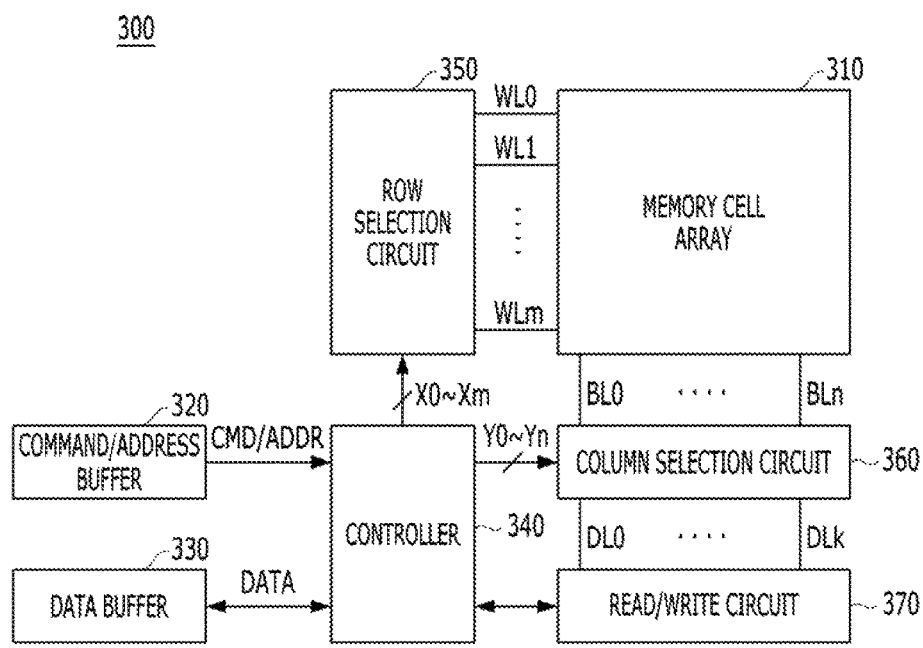
FIG. 3 is a block diagram illustrating a memory device in accordance with an embodiment of the present invention.

FIG. 3 is a block diagram illustrating a memory device 300 in accordance with an embodiment of the present invention.

Referring to FIG. 3, the memory device 300 in accordance with the present embodiment may include a memory cell array 310, a command/address buffer 320, a data buffer 330, a controller 340, a row selection circuit 350, a column selection circuit 360 and a read/write circuit 370.

The memory cell array 310 may include a plurality of memory cells (not shown) arranged in a matrix shape. The plurality of memory cells may be disposed in rows respectively coupled to word lines WL0 to WLm, and columns respectively coupled to bit lines BL0 to BLn. Each of the memory cells may include a memory element formed of a variable resistance element having a different resistance value, and an access element for controlling a current flowing through the memory element. The variable resistance element may be composed of a phase change material having a crystalline phase or amorphous phase, and the access element may include a diode or transistor coupled in series to the variable resistance element.

The controller 340 may control the row selection circuit 350, the column selection circuit 360 and the read/write circuit 370 according to a command CMD and address ADDR provided from the command/address buffer 320. Furthermore, the controller 340 may provide data DATA inputted through the data buffer 330 to the read/write circuit 370, or output data DATA read through the read/write circuit 370 to the data buffer 330.

In accordance with the present embodiment, when a write operation request is inputted from a host (not illustrated), the controller 340 may read data stored in the memory cell array 310, the data corresponding to write data, and compare the write data and the read data. That is, the controller 340 may read data of a memory cell corresponding to the address of the write data, among the plurality of memory cells of the memory cell array 310, and compare the write data and the read data. Then, according to the comparison result, the controller 340 may check bits different from corresponding bits of the read data, among a plurality of bits of the write data. After a preset time has elapsed from the write operation request, the controller 340 may output the check result to the outside, to notify the check result to the host. The operation of the controller 340 will be described in more detail with reference to FIG. 4.

The controller 340 may include a decoding circuit (not illustrated). In order to select the word lines WL0 to WLm and the bit lines BL0 to BLn coupled to the memory cell array 310, the controller 340 may decode the address ADD, and provide row selection signals X0 to Xm and column selection signals Y0 to Yn to the row selection circuit 350 and the column selection circuit 360, respectively. Thus, the row selection circuit 350 may select word lines among the plurality of word line WL0 to WLm in response to the row selection signals X0 to Xm, and the column selection circuit 360 may select bit lines among the plurality of bit lines BL0 to BLn in response to the column selection signals Y0 to Yn. The column selection circuit 360 may include a plurality of selection transistors (not shown). The plurality of selection transistors may couple the bit lines BL0 to BLn to data lines DL0 to DLk in response to the column selection signals Y0 to Yn.

Figure 4:
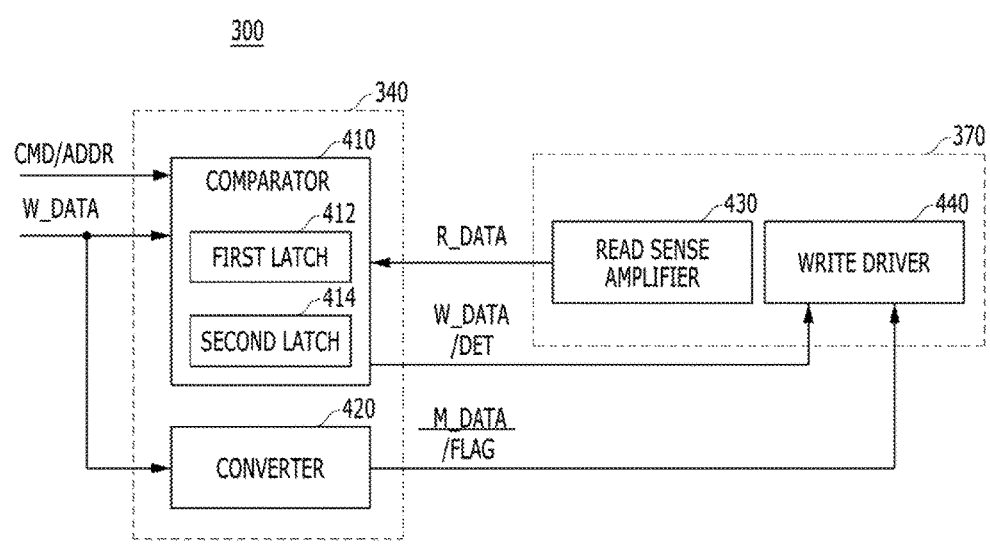
FIG. 4 is a detailed block diagram illustrating a controller and a read/write circuit shown in FIG. 3.

The read/write circuit 370 may read/write data from/to a memory cell selected in the memory cell array 310. The read/write circuit 370 may include a read sense amplifier for reading data stored in the memory cell array 310 and a write driver for writing data to the memory cell array 310. The read sense amplifier and the write driver are illustrated in FIG. 4. Hereafter, an operation of the memory device 300 in accordance with the present embodiment will be described in more detail with reference to FIG. 4.

FIG. 4 is a detailed block diagram illustrating the controller 340 and the read/write circuit 370 of FIG. 3.

Figure 2:
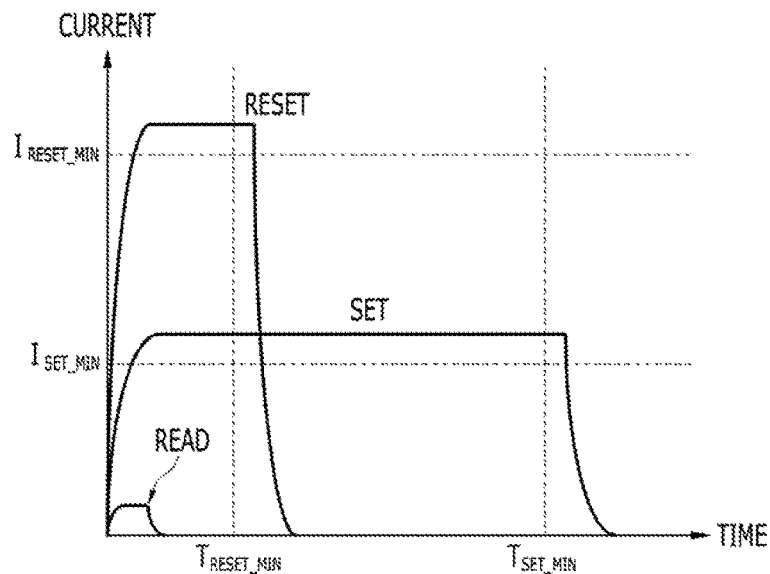
FIG. 2 is a graph illustrating current pulses for write and read operations of the PRAM illustrated in FIGS. 1A and 1B.

Referring to FIG. 4, the read/write circuit 370 may include a read sense amplifier 430 and a write driver 440. The controller 340 may control the read/write circuit 370 according to a read/write operation request from the host. When the read operation request is inputted, the controller 340 may control the read sense amplifier 430 to apply a read bias such as, the READ pulse of FIG. 2, to selected memory cells of the memory cell array 310. The read sense amplifier 430 may sense and amplify data stored in the selected memory cells. When the write operation request is inputted, the controller 340 may control the write driver 440 to apply a write bias such as, the RESET or SET pulse of FIG. 2, to selected memory cells of the memory cell array 310. The write driver 440 may store data into the selected memory cells by applying a write bias according to the logical value of the data.

In accordance with the present embodiment, the controller 340 may perform a read operation on selected memory cells of the memory cell array 310, corresponding to an address ADDR, in response to a command CMD for a write operation. Then, the controller 340 may receive read data R_DATA from the selected memory cells by the read sense amplifier 430. The controller 340 may include a comparator 410 for comparing the read data R_DATA with write data W_DATA inputted from outside during the write operation. The comparator 410 may include first and second latches 412 and 414 for storing the read data R_DATA and the write data W_DATA, respectively.

At this time, the read data R_DATA may include previously stored data in memory cells corresponding to the address ADDR of the write data W_DATA. The comparator 410 may compare the read data R_DATA and the write data W_DATA which are stored in the first and second latches 412 and 414, respectively, and generate detection information DET corresponding to the comparison result. The detection information DET may indicate a result obtained by checking bits different from the corresponding bits of the read data R_DATA, among the plurality of bits constituting the write data W_DATA.

The comparator 410 may perform an XOR operation on the read data R_DATA and the write data W_DATA, and provide an XOR operation result as the detection information DET. The detection information DET may be composed of a plurality of bits corresponding to the plurality of bits of the write and read data W_DATA and R_DATA. That is, the bit number of the detection information DET may correspond to the bit number of each of the read data R_DATA and the write data W_DATA. When the corresponding bits of the write and read data W_DATA and R_DATA are equal to each other, a corresponding bit of the detection information DET may have a logical value '0'. When the corresponding bits of the write and read data W_DATA and R_DATA are different from each other, the corresponding bit of the detection information DET may have a logical value '1'.

The write driver 440 of the read/write circuit 370 may write the write data W_DATA to the memory cell array 310, based on the detection information DET. The write driver 440 may write only specific bits of the write data W_DATA to the memory cell array 310, the specific bits corresponding to the detection information DET having a logical value '1'. The write driver 440 may apply the RESET and SET pulses according to the logical values of the specific bits of the write data W_DATA. Therefore, the RESET and SET pulses may be applied only to bits different from the corresponding bits of the read data R_DATA, among the plurality of bits of the write data W_DATA. Thus, the amount of current consumed during the write operation can be reduced, and the number of write operations for the plurality of memory cells of the memory cell array 310 can be reduced.

In accordance with another embodiment, the controller 340 may further include a converter 420. The converter 420 may modulate the write data W_DATA based on the detection information DET generated by the comparator 410, and provide modulated data M_DATA to the read/write circuit 370. The converter 420 may invert/non-invert the write data W_DATA according to the detection information DET, and output the inverted/non-inverted data as the modulated data M_DATA.

When the bit number of the detection information DET having a logical value '0', is equal to or greater than the bit number of the detection information DET having a logical value '1', the converter 420 may output the write data W_DATA as the modulated data M_DATA without inversion. That is, when the number of equal bits in the write and read data W_DATA and R_DATA is equal to or greater than the number of different bits, the write data W_DATA may be provided as the modulated data M_DATA without inversion. As described above, the write driver 440 may write the modulated data M_DATA to the memory cell array 310, based on the detection information DET.

When the bit number of the detection information DET having a logical value '0' is smaller than the bit number of the detection information DET having a logical value '1', the converter 420 may invert the write data W_DATA and output the inverted data as the modulated data M_DATA. That is, when the number of equal bits in the write and read data W_DATA and R_DATA is less than the number of different bits, the converter 420 may invert the write data W_DATA and provide the inverted data as the modulated data M_DATA.

At this time, the modulated data M_DATA may contain a larger number of bits having the same logical value as the read data R_DATA than the number of bits having a different logical value from the read data R_DATA. The converter 420 may set flag information FLAG indicating whether the data were inverted, and transmit the modulated data M_DATA with the flag information FLAG to the write driver 440. The write driver 440 may write the modulated data M_DATA to the memory cell array 310, based on the detection information DET and the flag information FLAG. Unlike the above-described configuration, however, the write driver 440 may write only specific bits of the modulated data M_DATA to the memory cell array 310, the specific bits corresponding to the detection information DET having a logical value '0'.

As the converter 420 inverts/non-inverts the write data W_DATA according to the comparison result between the write data W_DATA and the read data R_DATA, the write driver 440 may apply the RESET and SET pulses only to less than half of the bits of the write data W_DATA according to the logical values thereof. The flag information FLAG and the modulated data M_DATA may be stored together in the memory cell array 310, and read together during a read operation. The converter 420 may demodulate the modulated data M_DATA based on the read flag information FLAG.

In accordance with an embodiment of the present embodiment, the controller 340 may output the detection information DET to the outside according to a preset protocol, and notify a comparison result between the write data W_DATA and the previously stored data in the memory device 300, that is, the read data R_DATA, to the host, for example, a memory controller (not shown). Based on the comparison result, the memory controller may check bits of the write data, on which a write operation is actually performed, and the memory device 300 may calculate power consumed by the write operation. Therefore, when the memory device 300 is divided into a plurality of memory regions or memory banks and the divided banks are interleaved under a limited power budget, the number of interleaved memory banks may be adjusted according to the power consumption of the memory device 300.

For example, when the controller 340 modulates the write data W_DATA, the write driver 440 may substantially perform a write operation only on a half of the bits of the write data at the most. At this time, the number of memory banks interleaved through the write operation in the memory device 300 may be doubled. Furthermore, when bits of the write data, on which a write operation was omitted, are additionally checked based on the detection information DET transmitted from the memory device 300, the memory controller may add a write operation request to more memory banks of the memory device 300 in proportion to the checked bits.

Figure 5:
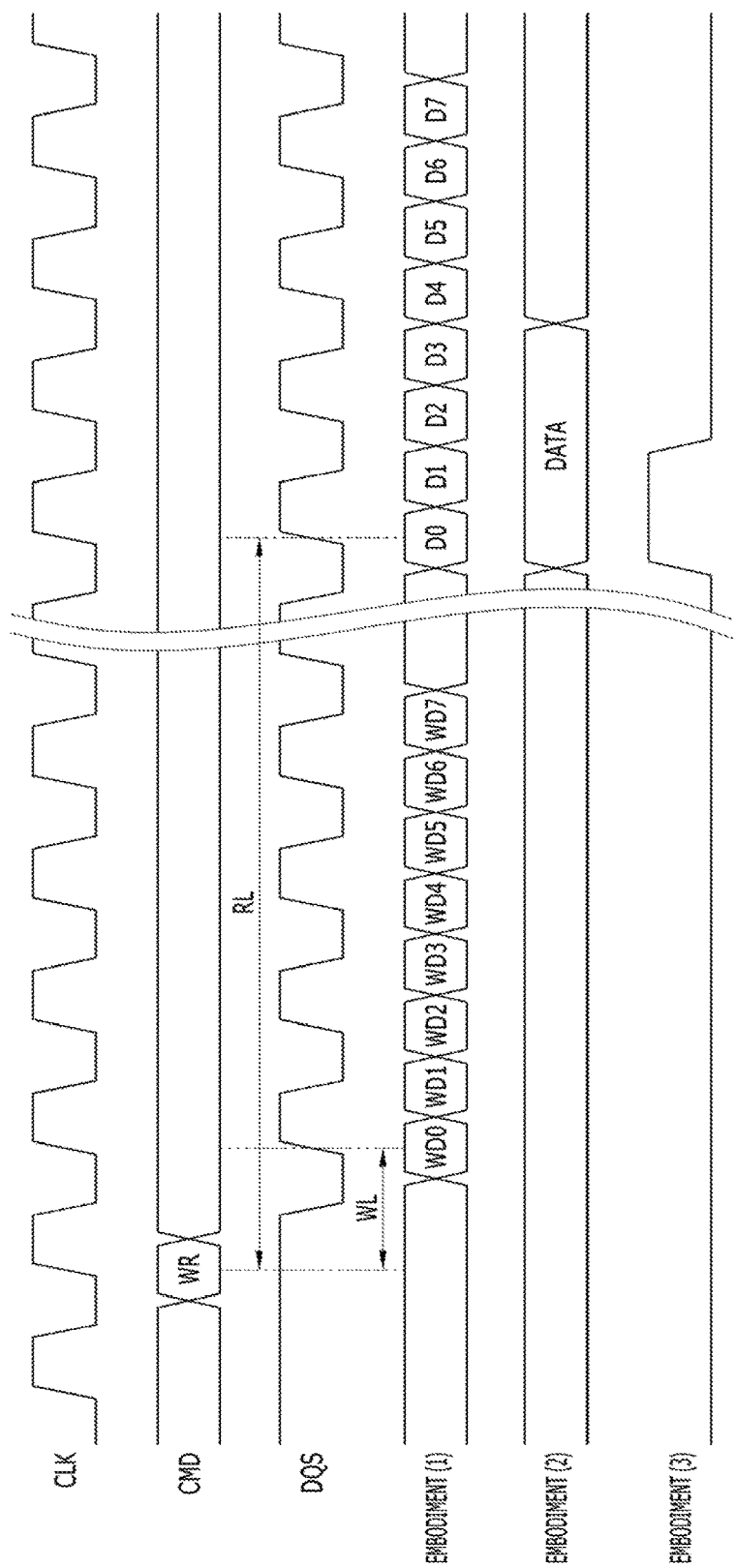
FIG. 5 is a waveform diagram for describing an operation of the controller of FIG. 3 to output detection information.

FIG. 5 is a waveform diagram for describing an operation of the controller 340 of FIG. 3 to output detection information DET.

When a preset time or read latency RL has elapsed from a write operation request, the controller 340 may output the detection information DET. In response to a command CMD indicating a write operation WR, the controller 340 may output the detection information DET after the read latency RL, based on a clock signal CLK.

In accordance with a first embodiment "EMBODIMENT (1)", the controller 340 may output the comparison result between the write data W_DATA and the previously stored data in the memory device 300, that is, the read data R_DATA, to a data input/output pin DQ. The controller 340 may perform an XOR operation on the write data W_DATA and the read data R_DATA, and output bits D0 to D7 having a logical value '0' or '1' through the data input/output pin DQ. Furthermore, the controller 340 may output a data strobe signal DQS with the bits D0 to D7.

The memory device 300 may receive write data WD0 to WD7 through the data input/output pin DQ, after write latency WL has elapsed from an input of the command CMD indicating the write operation WR. Therefore, the read latency RL in accordance with the present embodiment may correspond to a value obtained by adding the burst length of the write data WD0 to WD7 to the write latency WL.

In accordance with a second embodiment "EMBODIMENT (2)", the controller 340 may count the comparison result of the comparator 410. For example, the controller 340 may count the bit number of the detection information DET having a logical value '1', in order to count the number of bits different from the corresponding bits of the read data, among the plurality of bits of the write data W_DATA. The controller 340 may output a preset level of data DATA at a bandwidth corresponding to the counting number through a data input/output pin DQ. For example, when the bit number of the detection information DET having a logical value '1' is 4, the controller 340 may output the data DATA having a logical value '1' for 2 clock periods corresponding to a 4-bit data width. As described above, the read latency RL may correspond to a value obtained by adding the burst length of the write data WD0 to WD7 to the write latency WL.

In accordance with a third embodiment "EMBODIMENT (3)", the controller 340 may output the detection information DET using a pin separately set in the memory device 300, for example, an RFU (Reserved for Future Use) pin. As described above, the controller 340 may count the bit number of the detection information DET having a logical value '1', and enable a detection signal when the counting number is equal to or greater than a threshold value. The controller 340 may output the enabled detection signal through the RFU pin, to notify the comparison result between the write data and the previously stored data in the memory device 300, to the memory controller. At this time, the read latency RL may correspond to a time which is preset according to a protocol between the memory device 300 and the memory controller.

Hereinafter, referring to FIGS. 3 to 6, an operation of a memory device will be described.

Figure 6:
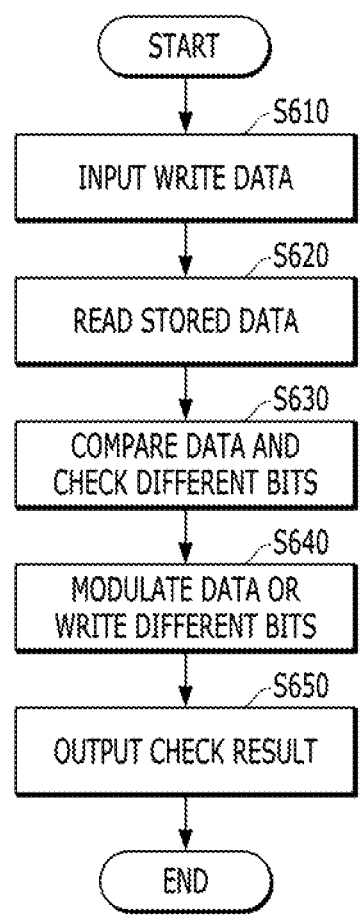
FIG. 6 is a flowchart for describing an operation of a memory device in accordance with an embodiment of the present embodiment.

FIG. 6 is a flowchart for describing an operation of the memory device 300 in accordance with an embodiment of the present embodiment.

1) Inputting Write Data at Step S610

For a write operation of the memory device 300, a write command CMD and write data W_DATA may be transmitted from the host. The controller 340 of the memory device 300 may receive the write data W_DATA and temporarily store the write data W_DATA in one of the first and second latches 412 and 414, in response to the write command CMD.

2) Reading Stored Data at Step S620

The controller 340 may read data of a memory cell corresponding to the address ADDR of the write data W_DATA, among the plurality of memory cells of the memory cell array 310. The controller 340 may control the read sense amplifier 430 to sense and amplify the data of the corresponding memory cell. The controller 340 may receive read data R_DATA from the read sense amplifier 430, and temporarily store the read data R_DATA in the other of the first and second latches 412 and 414.

3) Comparing Data and Checking Different Bits at Step S630

The comparator 410 included in the controller 340 may compare the write and read data W_DATA and R_DATA stored in the first and second latches 412 and 414. According to the comparison result, the comparator 410 may check bits different from the corresponding bits of the read data R_DATA, among the plurality of bits constituting the write data W_DATA.

4) Modulating Data or Writing Different Bits at Step S640

In accordance with an embodiment, the read/write circuit 370 may write only the bits different from the corresponding bits of the read data R_DATA, among the plurality of bits of the write data W_DATA, based on the check result of the comparator 410, that is, the detection information DET. Specifically, based on the detection information DET, the write driver 440 included in the read/write circuit 370 may apply a write bias (RESET or SET pulse) only to the bits different from the corresponding bits of the read data R_DATA, among the plurality of bits of the write data W_DATA.

In accordance with another embodiment, the controller 340 may modulate the write data W_DATA based on the detection information DET. That is, the converter 420 included in the controller 340 may invert/non-invert the write data W_DATA based on the detection information DET, and set the flag information FLAG indicating whether the write data were inverted/non-inverted. Thus, the read/write circuit 370 may write the modulated data M_DATA to the memory cell array 310, based on the detection information DET and the flag information FLAG.

5) Outputting Check Result at Step S650

After a preset time has elapsed from the input of the write command CMD, the controller 340 may output the check result of the comparator 410 to the outside. After a time corresponding to the write latency WL of the memory device 300 and the burst length of the write data W_DATA has elapsed from the input of the write command CMD, the controller 340 may output the detection information DET to the outside.

In accordance with the first embodiment (refer to EMBODIMENT (1) of FIG. 5), the comparator 410 may perform an XOR operation on the write and read data W_DATA and R_DATA. The controller 340 may output an XOR operation result of the write and read data W_DATA and R_DATA through the data input/output pin DQ of the memory device 300.

1 In accordance with the second embodiment (refer to EMBODIMENT (2) of FIG. 5), the controller 340 may check bits different from the corresponding bits of the read data R_DATA, among the plurality of bits of the write data W_DATA, based on the check result of the comparator 410, and count the checked bits. The controller 340 may output a preset level of data DATA at a bandwidth corresponding to the counting number through the data input/output pin DQ of the memory device 300.

In accordance with the third embodiment (refer to EMBODIMENT (3) of FIG. 5), the controller 340 may check bits different from the corresponding bits of the read data R_DATA, among the plurality of bits of the write data W_DATA, based on the check result of the comparator 410, and count the checked bits. At this time, when the counting number is equal to or greater than the threshold value, the controller 340 may enable a detection signal, and output the enabled detection signal through a preset pin of the memory device 300, for example, the RFU pin.

In accordance with the present embodiments, the nonvolatile memory device having a limited number of write operations can perform a write operation only on data different from the previously stored data therein, among write data, thereby reducing the number of write operations. Furthermore, the memory device can modulate the write data depending on the data different from the previously stored data therein, among the write data, thereby reducing power consumption caused by the write operation.

At this time, the memory device can notify information on the data different from the previously stored data therein, among the write data, to the controller according to a preset protocol. Therefore, since power which is actually consumed in the memory device can be checked, it is possible to efficiently perform power management on a plurality of memory devices.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
    a memory cell array having a plurality of memory cells;
    a controller having a comparator and configured to read previous data in response to a write command for a write operation, of a memory cell corresponding to an address of write data; and
    a read/write circuit configured to write the write data in the memory cell corresponding to the address of the write data,
    wherein the comparator compares the write data and the read previous data to check for bits in the write data which are different from corresponding bits in the read previous data, and generates a check result which identifies specific bits in the write data which are different from the read previous data,
    wherein the read/write circuit writes only the specific bits of the write data in the memory cell corresponding to the address of the write data, and
    wherein the controller outputs the check result to a host outside the memory device after a preset time from the write operation request.

2. The memory device of claim 1, wherein when the memory device performs the write operation in response to the write command, the controller outputs the check result to the host after a time corresponding to a burst length of the write data and a write latency of the memory device from an input of a write command.

3. The memory device of claim 1, wherein the controller performs an XOR operation on the write data and the read previous data, and outputs an XOR operation result as the check result through a data input/output pin of the memory device.

4. The memory device of claim 3, wherein
    the read/write circuit is configured to write the specific bits of the write data to the memory cell array based on the XOR operation result, according to a control of the controller.

5. The memory device of claim 1, wherein the controller counts a number of the specific bits of the write data, and outputs a preset level of data at a bandwidth corresponding to the counting number, as the check result through a data input/output pin of the memory device.

6. The memory device of claim 1, wherein:
    the controller counts a number of the specific bits of the write data; and
    when the counting number is equal to or greater than a threshold value, the controller enables a detection signal and outputs the detection signal as the check result through a preset pin of the memory device.

7. A memory device comprising:
    a memory cell array having a plurality of memory cells;
    a controller configured to read previous data in response to a write operation request, of a memory cell corresponding to an address of write data, and to check for bits in the write data which are different from corresponding bits in the read previous data, and modulate the write data based on a check result which identifies specific bits the write data which are different from the read previous data; and
    a read/write circuit configured to write the modulated data to the corresponding memory cell based on the check result,
    wherein the controller outputs the check result outside the memory device to a host after a preset time from the write operation request.

8. The memory device of claim 7, wherein the controller comprises:
    a comparator configured to perform an XOR operation on the write data and the read previous data, and output detection information composed of a plurality of bits having a first logical value when corresponding bits of the read previous data and the write data are equal to each other, and a second logical value when the corresponding bits of the read previous data and the write data are different from each other; and
    a converter configured to generate the modulated data by inverting/non-inverting the write data based on the detection information.

9. The memory device of claim 8, wherein:
    when a number of bits having the first logical value is equal to or greater than a number of bits having the second logical value, among the plurality of bits of the detection information,
    the converter non-inverts the write data, and outputs the non-inverted data as the modulated data; and
    the read/write circuit writes bits of the modulated data corresponding to the bits having the second logical value, to the corresponding memory cell.

10. The memory device of claim 8, wherein:
    when a number of bits having the first logical value is less than a number of bits having the second logical value, among the plurality of bits of the detection information, the converter inverts the write data, and outputs the inverted data as the modulated data while setting flag information; and the read/write circuit writes bits of the modulated data corresponding to the bits having the first logical value, the corresponding memory cell.

11. The memory device of claim 7, wherein the controller performs an XOR operation on the write data and the read previous data, and outputs an XOR operation result through a data input/output pin of the memory device, after a time corresponding to a write latency and a burst length of the write data from the write operation request.

12. The memory device of claim 7, wherein the controller counts a number of the specific bits of the write data, and outputs a preset level of data at a bandwidth corresponding to the counting number through a data input/output pin of the memory device, after a time corresponding to a write latency and a burst length of the write data from the write operation request.

13. The memory device of claim 7, wherein:
the controller counts a number of the specific bits of the write data; and
when the counting number is equal to or greater than a threshold value, the controller enables a detection signal and outputs the detection signal through a preset pin of the memory device, after a time corresponding to a write latency and a burst length of the write data from the write operation request.

14. An operating method for a memory device, comprising:
receiving write data to store in a memory cell array including a plurality of memory cells, in response to a write command;
reading previous data of a memory cell corresponding to an address of the write data among the plurality of memory cells, in response to the write command;
comparing the write data and the read previous data, and checking for bits in the write data which are different from corresponding bits in the read previous data;
generating a check result which identifies specific bits in the write data which are different from the read previous data; and
outputting a check result outside the memory device to a host, after a preset time from an input of the write command.

15. The operating method of claim 14, wherein the preset time comprises a value obtained by adding a time corresponding to a burst length of the write data to a write latency of the memory device.

16. The operating method of claim 14, wherein the outputting of the check result comprises:
outputting an XOR operation result performed on the write data and the read previous data as the check result through a data input/output pin of the memory device.

17. The operating method of claim 14, wherein the outputting of the check result comprises:
counting a number of the specific bits of the write data; and
outputting a preset level of data at a bandwidth corresponding to the counting number, as the check result through a data input/output pin of the memory device.

18. The operating method of claim 14, wherein the outputting of the check result comprises:
counting a number of the specific bits of the write data; and
enabling a detection signal and outputting the detection signal through a preset pin of the memory device, when the counting number is equal to or greater than a threshold value.

19. The operating method of claim 14, further comprising:
writing the specific bits of the write data to the corresponding memory cell based on the check result.

20. The operating method of claim 14, further comprising:
inverting/non-inverting the write data based on the check result, and setting flag information indicating whether the write data are inverted/non-inverted; and
writing the inverted/non-inverted data to the corresponding memory cell based on the check result and the flag information.

21. The memory device of claim 1, wherein the host calculates power consumption of the write operation based on the check result.

22. The memory device of claim 7, wherein the host calculates power consumption of the write operation based on the check result.

23. The memory device of claim 14, wherein the host calculates power consumption of the write operation based on the check result.

* * * * *